(12) United States Patent
Mahler et al.

(10) Patent No.: US 7,994,646 B2
(45) Date of Patent: Aug. 9, 2011

(54) SEMICONDUCTOR DEVICE

(75) Inventors: Joachim Mahler, Regensburg (DE);
Edward Fuergut, Dasing (DE);
Manfred Mengel, Bad Abbach (DE);
Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 217 days.

(21) Appl. No.: 12/337,245

(22) Filed: Dec. 17, 2008

(65) Prior Publication Data
US 2010/0148381 A1 Jun. 17, 2010

(51) Int. Cl.
*H01L 23/29* (2006.01)
(52) U.S. Cl. .......... 257/789; 257/794; 257/E23.118
(58) Field of Classification Search .......... 257/789, 257/794, E23.118, E23.119
See application file for complete search history.

(56) References Cited

U.S. PATENT DOCUMENTS

| | | | | |
|---|---|---|---|---|
| 4,816,299 A | * | 3/1989 | Alpha et al. | 427/221 |
| 7,790,576 B2 | * | 9/2010 | Bathan et al. | 438/462 |
| 2001/0016400 A1 | | 8/2001 | Lee | |
| 2006/0197190 A1 | | 9/2006 | Doan | |
| 2007/0236859 A1 | * | 10/2007 | Borland et al. | 361/272 |

FOREIGN PATENT DOCUMENTS

DE 10158307 A1 2/2003
* cited by examiner

*Primary Examiner* — Lex Malsawma
(74) *Attorney, Agent, or Firm* — Dicke, Billig & Czaja, PLLC

(57) ABSTRACT

A semiconductor device is disclosed. One aspect provides a semiconductor device that includes a semiconductor chip including a first face and a second face opposite the first face, an encapsulant including inorganic particles encapsulating the semiconductor chip, a first metal layer attached to the first face of the semiconductor chip, a second metal layer attached the second face of the semiconductor chip, and electrically conducting material configured to connect the first metal layer with the second metal layer.

16 Claims, 7 Drawing Sheets

SEMICONDUCTOR DEVICE

BACKGROUND

Market demands for smaller and more functional electronic devices have driven the development of semiconductor devices, including semiconductor packages, and entire systems disposed on a chip. In general, semiconductor packages include at least one semiconductor chip covered with a plastic or epoxy encapsulation material. Some electronic devices are employed in high temperature applications, for example, automotive applications, and operate in demanding environments.

Thermal cycling of the semiconductor package has the potential to separate the semiconductor chip from the encapsulation material, due in part to these components having different thermal coefficients of expansion. The separation at the interface of the semiconductor chip and the encapsulation material provides an opening for the ingress of moisture. The moisture ingress undesirably corrodes electrical connections on the chip and has the potential to warp or otherwise affect the dimensions of the chip.

For these and other reasons there is a need for the present invention.

SUMMARY

One aspect provides a semiconductor device including a semiconductor chip having a first face and a second face opposite the first face, an encapsulant having inorganic particles encapsulating the semiconductor chip, a first metal layer attached to the first face of the semiconductor chip, a second metal layer attached the second face of the semiconductor chip, and electrically conducting material connecting the first metal layer with the second metal layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
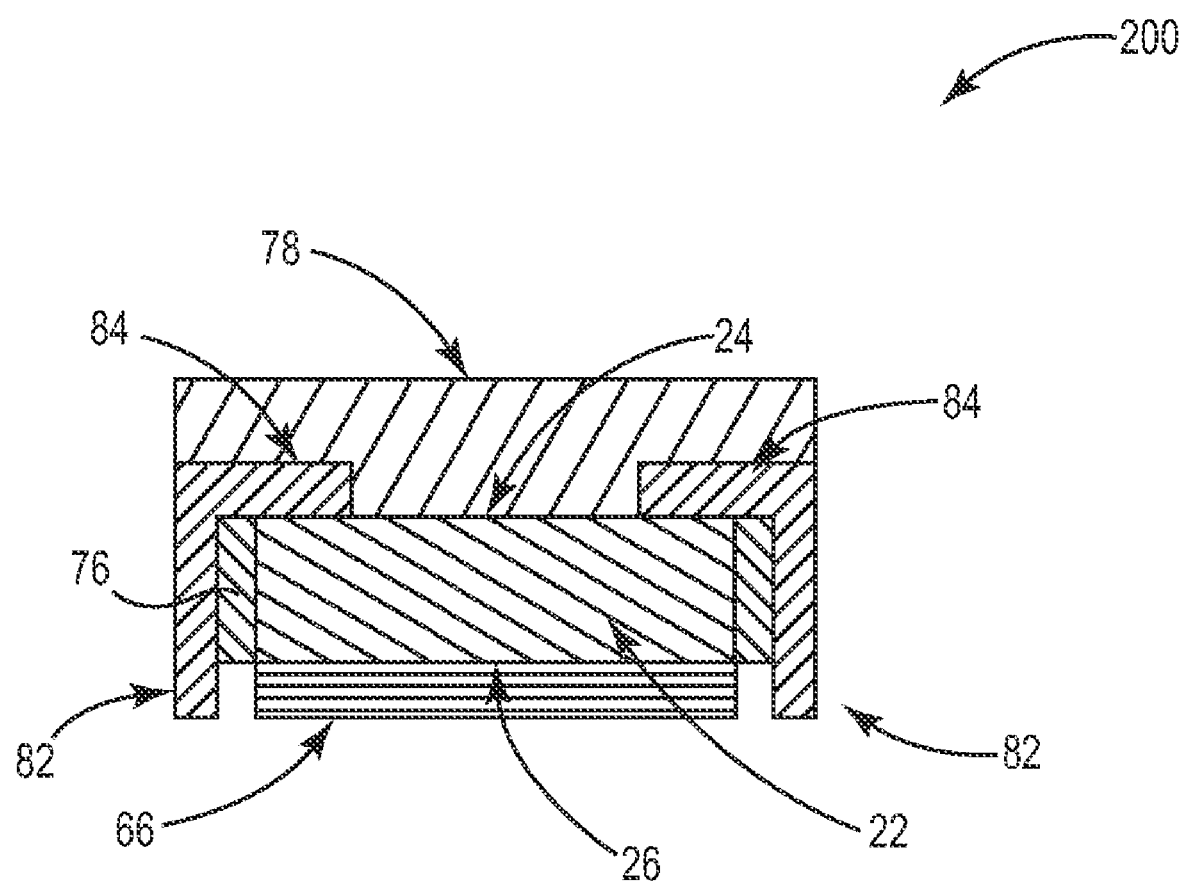
FIG. 1 is a schematic cross-sectional view of one embodiment of a semiconductor chip.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements are directly coupled together; intervening elements may be provided between the "coupled" or "electrically coupled" elements.

Embodiments provide an inorganic encapsulant for semiconductor packages having improved thermal stability, which minimizes or eliminates moisture ingress between the encapsulant and chip(s) of the package, thus configuring the package for improved reliability over a broader thermal spectrum of use.

Embodiments provide for reducing stress as semiconductor devices are exposed to high temperatures and protecting the semiconductor chips against moisture damage to electrical contacts.

Embodiments provide hermetic encapsulant for wafer level packaging of semiconductor devices. In one embodiment, a wafer includes a metallization layer and chips coupled to the metallization layer. An encapsulant of inorganic particles is deposited between the semiconductor chips spaced on the carrier. The encapsulant particles are hardened between the chips and subsequently sawn or otherwise divided to provide through-openings. An electrically conducting material is placed between the newly divided encapsulant and attached to the first face and second face of the semiconductor chips. Etching or other methods used in the semiconductor industry is implemented on the electrically conducting material placed on the first and second face to provide electrical pathways. In one embodiment, the electrically conductive material is ultimately structured to provide separate gate, source, and drain contacts for each chip. The semiconductor packages are ultimately singulated from the wafer for subsequent use with other devices. After singulation from the wafer, complete semiconductor packages are provided that are suited for assembly and/or attachment to printed circuit boards and other electronic devices.

FIG. 1 is a schematic cross-sectional view of a single semiconductor device 200 after singulation. Semiconductor device 200 includes a semiconductor chip 22 at least partially encapsulated by an encapsulant 76/78, a first metal layer 84 attached to a first face 24 of the semiconductor chip 22, a second metal layer 66 attached to a second face 26 of semiconductor chip 22, and electrically conducting material 82 configured to connect first metal layer 84 with second metal layer 66. In one embodiment, device 200 is connected to a board or other device and electrically conducting material 82 connects first metal layer 84 with second metal layer 66.

In one embodiment, first metal layer 84 is an electrically conductive material that laterally extends over first face 24 of semiconductor chip 22 and encapsulant 76. Electrically conductive material 84 is connected with electrically conductive material 82. Electrically conductive material 82 is deposited alongside the semiconductor chip 22, between the electrically conductive material 84 and extending toward second face 26 of semiconductor chip 22.

In one embodiment, encapsulant 76 is deposited separately from encapsulant 78, but it is to be understood that encapsulant 76 is similar to or the same as encapsulant 78. In one embodiment, semiconductor chip 22 is attached at second face 26 to electrically conductive material 66 and encapsulant 76/78 is placed over the exposed area of first face 24 and electrically conductive material 84.

In one embodiment, encapsulant 76/78 includes inorganic particles. Encapsulant 76/78 is configured to have a coefficient of thermal expansion (CTE) of less than approximately $10 \times 10^{-6}$/K, which closely approximates the CTE of silicon in silicon chips (about $2.5 \times 10^{-6}$/K). In contrast, conventional epoxy or polymer encapsulant materials typically have a larger CTE of approximately $1 \times 10^{-5}$/K, or about an order of magnitude larger than the CTE for silicon. The mismatch between the CTE of the conventional epoxy or polymer encapsulant materials and silicon contributes to unequal thermal expansion of the materials as the materials are thermally cycled, which has the potential to undesirably separate the materials and create a pathway for moisture ingress to the semiconductor package.

Suitable materials for encapsulant 76/78 include inorganic or organic materials or ceramic materials. In one embodiment, encapsulant 76/78 is provided as a ceramic material. Suitable ceramic materials include aluminum oxide, silicon oxide, zirconium oxide, silicon carbide oxide, and other suitable compositions of such oxides. In one embodiment, encapsulant 76/78 is provided as an organo-metallic material. Suitable organo-metallic materials include polysiloxane and organically modified silicates. In one embodiment, encapsulant 76/78 is provided as a ceramic-like glass. Suitable ceramic-like glass materials include boron oxide, bismuth oxide, zinc oxide, silicon oxide or tin oxide, for example.

In one embodiment, encapsulant 76/78 is hardened through a sintering process in which the particles are fused together to solidify or harden encapsulant 76/78. In one embodiment, encapsulant 76/78 is fabricated as a sol-gel from a suspension of organo-metallic or ceramic nano-particles with processing temperatures between approximately 200-400 degrees Celsius. In one embodiment, encapsulant 76/78 is deposited as a paste in a printing process, like a base-printing or template-printing, and then processed at temperatures between 300-450 degrees Celsius to harden the particles into a sintered mass.

After curing, encapsulant 76/78 provides stability to the array of semiconductor chips 22 with temperature stability of greater than 300 degrees Celsius and moisture resistance. Encapsulant 76/78 allows for lower coefficient of thermal expansion as compared to other (e.g., epoxy) materials. Encapsulant 76/78 results in less corrosion of the devices due to ionic contamination. In one embodiment, encapsulant 76/78 provides a hermetic seal around semiconductor chip 22 and is configured to impede moisture ingress. Various techniques are employed to embed the semiconductor chips 22 with encapsulant 76/78, for example, compression molding, and injection molding, lamination or dispensing.

In one embodiment, electrically conductive materials 66, 82 and 84 are any conductive material, for example, copper, gold, silver, alloys of these metals or other metals. Electrically conductive material 66, 82 and 84 are deposited with any suitable deposition process. Suitable deposition processes include chemical deposition, galvanic deposition, vapor deposition, sputtering, or otherwise coating a conductive material of suitably high thermal and electrical conductivity. Electrically conductive materials interconnect for the gate source entering. Metallized deposits form the drain, source and gate contacts.

FIG. 2A through FIG. 8 illustrate hermetic encapsulant for power devices according to one embodiment.

Figure 2A:
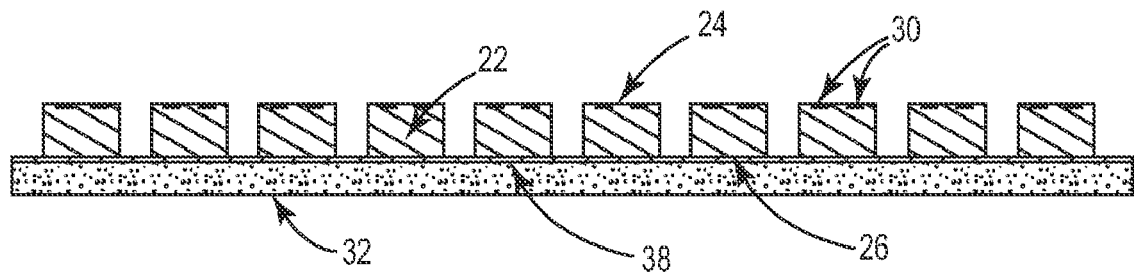
FIGS. 2A-8 illustrate schematic cross-sectional views of semiconductor dies placed on a carrier and fabricated to provide semiconductor devices according to one embodiment.

FIG. 2A illustrates on embodiment in which semiconductor chips 22 are placed at a predetermined spacing on wafer carrier 32 coupled with adhesive foil 38. In one embodiment, chips 22 include control chips, logic chips, vertical high voltage chips, power transistor chips, metal oxide semiconductor field effect transistor chips, or other suitable semiconductor dies. In one embodiment, at least two semiconductor chips 22 are placed with first face 24 exposed and second face 26 attached to foil adhesive 38. In this manner, contacts 30 are exposed, as seen in FIGS. 2A-2C and FIG. 3.

In one embodiment, semiconductor chip 22 has at least one contact 30 on first face 24. In one embodiment, semiconductor chip 22 also has at least one contact on second face 26. In one embodiment, semiconductor chips 22 are powered transistors, contacts 30 is a source terminal and contact 30 is a gate terminal. In another embodiment, semiconductor chip 22 is a power diode and only one contact 30 (e.g. the anode terminal) is provided on first face 24. In another embodiment, semiconductor chip 22 is a logic integrated circuit, typically with several contacts 30 are arranged on first face 24.

In one embodiment, adhesive foil 38 is a metallization layer such as a metallized adhesive, metallized seed layer, metallized substrate, a carrier, or other suitable metallic layer, in forming the wafer. In one embodiment, the wafer 32 is configured to include chips 22 spaced apart to define a "fan-out" area on the wafer, and a metallized seed layer is deposited onto a major surface of a reconfigured wafer by chemical deposition, electroless deposition, or sputtering. In another embodiment, the chips are disposed onto a carrier including a metallic layer.

Figure 2B:
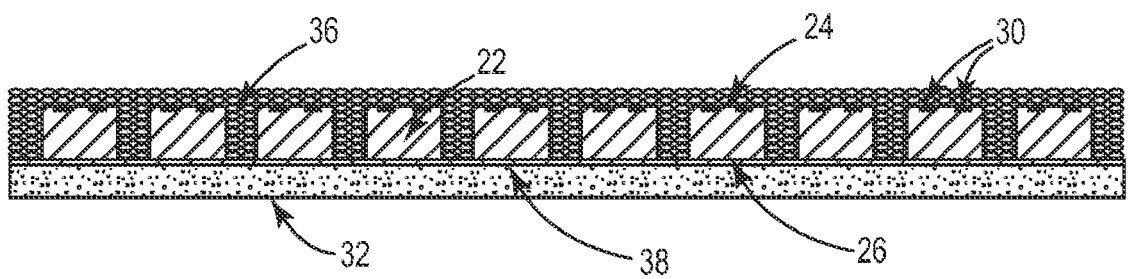
Figure 2C:
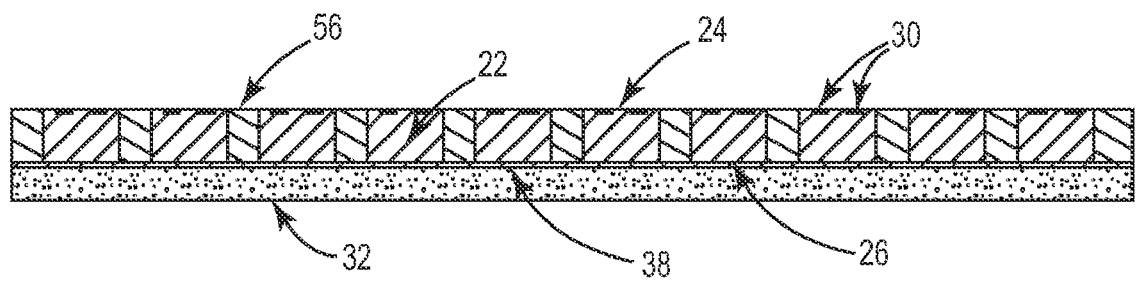

FIG. 2B illustrates semiconductor chips 22 applied to wafer carrier 32 with encapsulant particles 36 applied over carrier 32 and semiconductor chips 22 and between semiconductor chips 22 on wafer carrier 32. The encapsulant particles 36 are deposited onto the selectively exposed portion of the adhesive foil 38. FIGS. 2B and 2C further illustrate encapsulant particles 36 solidified into encapsulant material 56 while semiconductor chips 22 are adhered to wafer carrier 32. In one embodiment, encapsulant particles 36 are hardened through a sintering process in which encapsulant particles 36 react and solidify into encapsulant 56. In one embodiment, particles 36 and/or hardened encapsulant 56 are skived off or planarized to top surface 24 of semiconductor chips 22.

Figure 3:
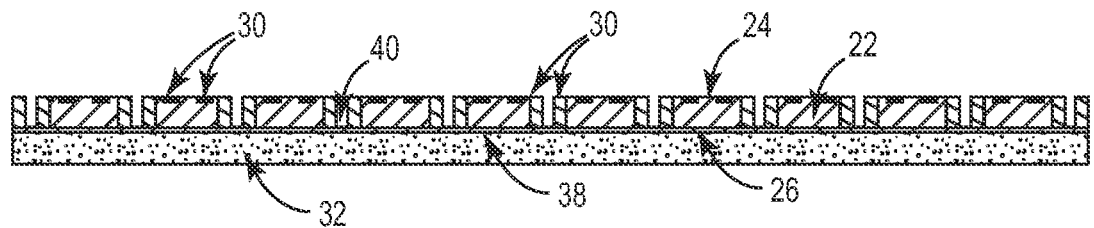

FIG. 3 is a schematic illustration of a semiconductor structure according to one embodiment. In one embodiment, dicing is used to provide through openings 40 of the encapsulant 56 between semiconductor chips 22 after hardening. In one embodiment, dicing methods known in the industry are used such as sawing and cutting through the encapsulant 56 until the adhesive layer 38 is reached. In one embodiment, semiconductor chips 22 are separated so that encapsulant 56 remains attached to the sides of semiconductor chips 22.

Figure 4:
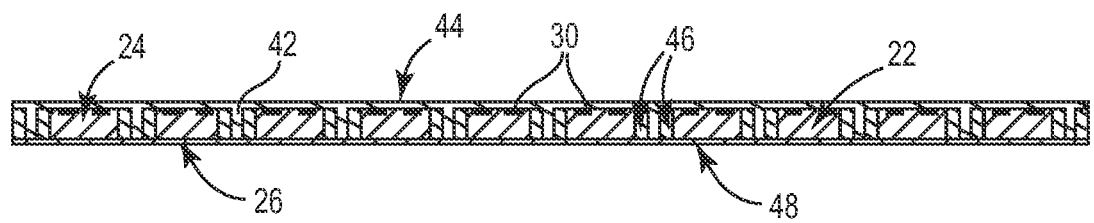

FIG. 4 is a schematic illustration of a semiconductor structure according to one embodiment after wafer carrier 32 has been released. In one embodiment, metallized material 42 is deposited into through openings 40 between each semiconductor chip 22. In one embodiment, metallized material 44 laterally extends over active first face 24 of semiconductor chip 22 and is electrically connected to contacts 30. In one embodiment, metallized backside 48 is attached to second face 26 of semiconductor chip 22. In another embodiment, metallized backside 48 is strengthened galvantically to the desired thickness of up to 250 μm, on the second face 26 of semiconductor chip 22.

Figure 5:
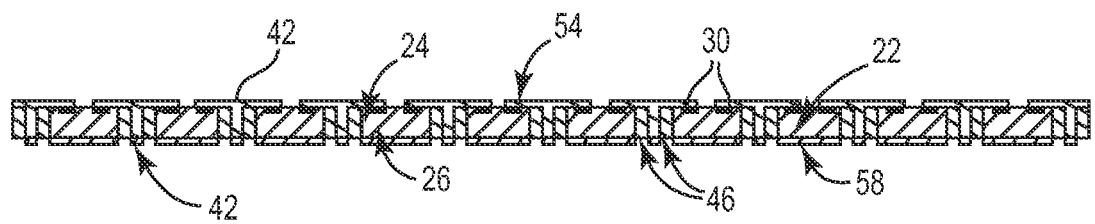

FIG. 5 is a schematic illustration of a semiconductor structure according to one embodiment. Semiconductor chip 22 is connected to metal deposit 54 at contacts 30 on the first face 24 of semiconductor chip 22. Metal deposits 42 extend from metallized deposit 54 at first face 24 of semiconductor chip 22 between encapsulant 46 to metallized deposit 58. In one embodiment, metallized deposit 58 is selectively etched on second face 26 of semiconductor chip 22 to remain insulated by the encapsulant 46. In another embodiment, metallized deposit 54 is selectively etched on first face 24 of semiconductor chip 22. More specifically the structure is subjected to an etchant. The etchant material depends on the composition of the metallized material. In one embodiment, photolithic or laser methods are employed such that between the gate source and drain contacts of the individual units, no electrically conductive connections remain.

Figure 6:
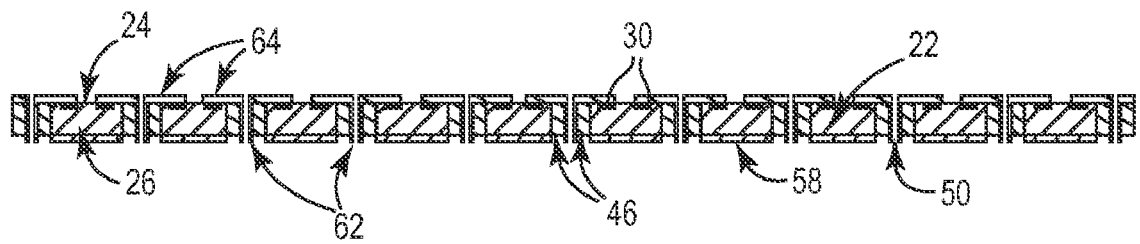

FIG. 6 illustrates a schematic drawing of a semiconductor device according to one embodiment upon separation of the semiconductor devices. Metallized deposits 62 have been sawn or otherwise separated such that source drains on either side of through opening 50 extend from metallized deposit 64 on the first face 24 to metallized deposit 58 on the second face 26 of semiconductor chip 22. In one embodiment, separation of the metallized material 62 is provided through singulation. In this manner, isolated semiconductor devices can be directly placed on printed circuit boards with the first face 24, the active face, of semiconductor chip 22 coupled to the printed circuit board.

Figure 7:
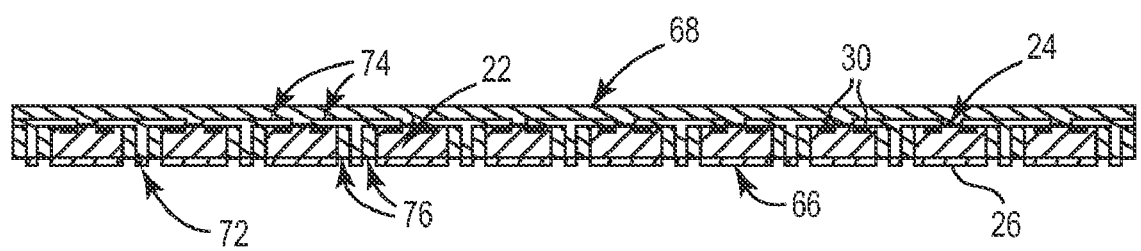

FIG. 7 is a schematic of a semiconductor device according to one embodiment. In one embodiment, wafer level encapsulation of front side 24 of semiconductor chip 22 is provided prior to separation of the semiconductor devices. In one embodiment, encapsulant 68 is provided on the exposed front side 24 of semiconductor chip 22 and metallized layer 74.

Figure 8:
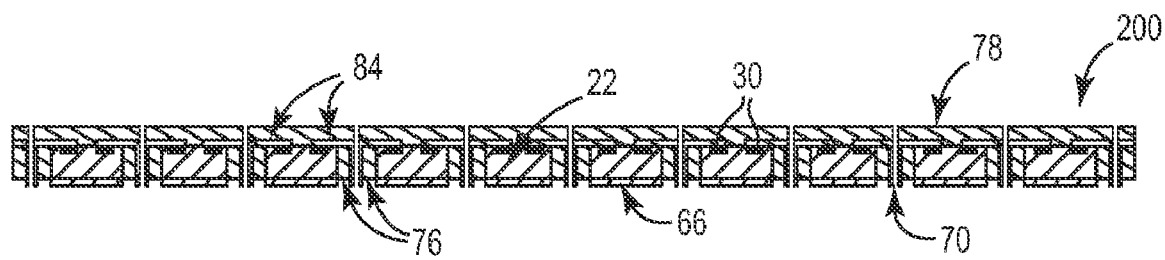

FIG. 8 illustrates a semiconductor structure according to one embodiment after singulation of the semiconductor devices. Semiconductor devices 200 have been singulated at through opening 70 between semiconductor chips 22. In one embodiment, encapsulant 78 has been ground down. Individual semiconductor units become, by way of the encapsulation material and the lateral layers of metal, separated from each other. In this manner, the isolated, or separated, semiconductor device 200 can be connected directly with the lower backside on the printed circuit board.

Figure 9:
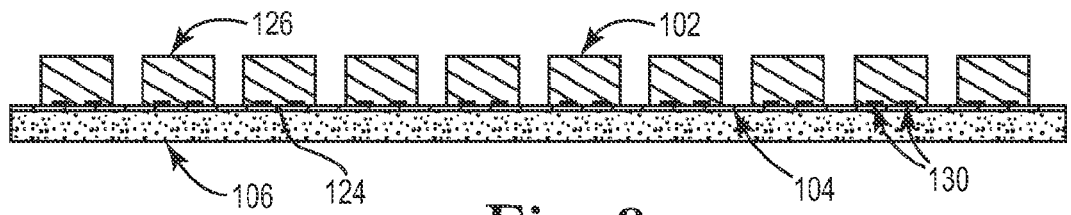
FIGS. 9-18 are schematic illustrations of the fabrication of a thin die semiconductor structure according to one embodiment.

FIGS. 9-18 illustrate semiconductor structures according to one embodiment for thin dies. As illustrated in FIG. 9, semiconductor devices 102 are attached to metallized adhesive 104 on wafer carrier 106. Semiconductor chips 102 are placed with first face 124 on metallized adhesive 104 and second face 126 exposed. Semiconductor chips 102 are placed at predetermined spacing on adhesive 104 and wafer carrier 106. Contacts 130 on first face 124 of semiconductor chip 102 are in contact with metallized adhesive 104 on wafer carrier 106.

Figure 10:
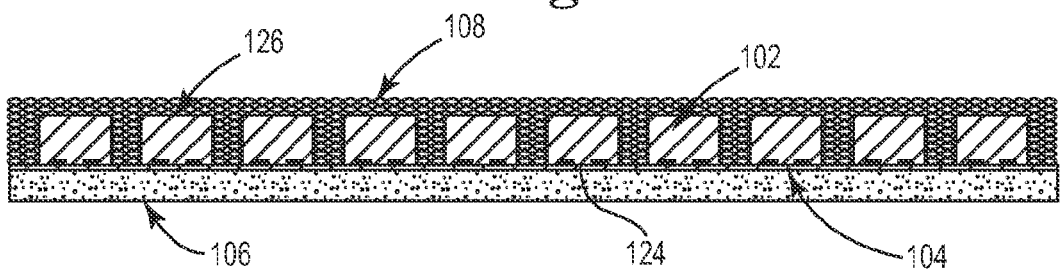
Figure 11:
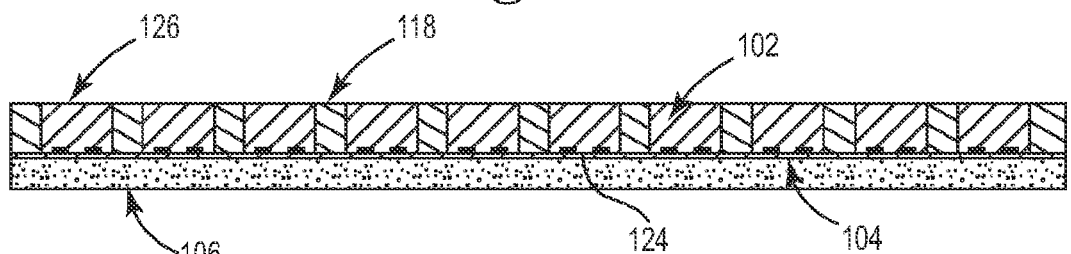
Figure 12:
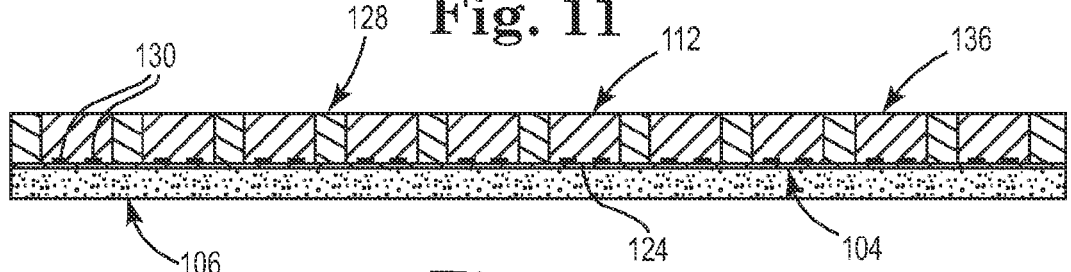

In one embodiment, FIG. 10 illustrates encapsulant particles 108 are placed on the second face 126 of semiconductor chips 102 as well as between the semiconductor chips 102 on adhesive 104. In one embodiment, FIG. 11 illustrates encapsulant 118 hardened through a processing step wherein heating encapsulant 118 in a range between 200-400 degrees Celsius. In one embodiment, the heating process, or sintering, hardens encapsulant 118 and solidifies the material between the semiconductor chips 102. In one embodiment, encapsulant 118 is sanded or ground off from second face 126 of semiconductor chips 102. In another embodiment, encapsulant 118 and second face 126 of semiconductor chip 112 is further sanded or ground off until the desired semiconductor chip 112 thickness is achieved. As such, the grinding or sanding takes place on inactive backside, or second face of semiconductor chip 112, as seen in FIG. 12. In one embodiment, the active side, first face 124 including contacts 130, of semiconductor chips 112 remain attached to metallized adhesive 104.

Figure 13:
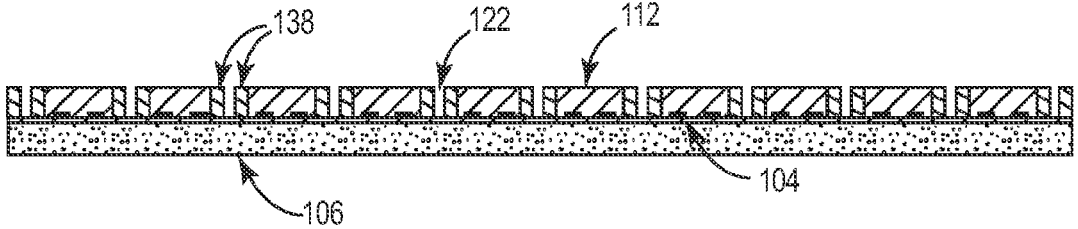

FIG. 13 illustrates semiconductor structure according to one embodiment when encapsulant 138 is diced between semiconductor chips 112 until adhesive material 104 is reached. Alternatively, encapsulant 138 is sawn through, leaving some encapsulant 128 attached to adhesive material 104 on either side of through opening 122. In this manner, semiconductor chips 112 are isolated.

Figure 14:
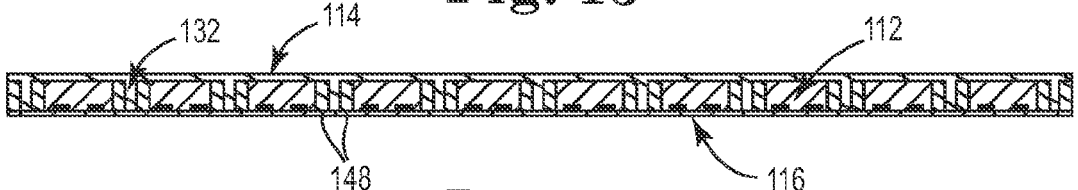

FIG. 14 illustrates wafer carrier 106 released from semiconductor chips 112. In one embodiment metallized material 116 is deposited on first face 124, metallized material 114 is deposited on second face 126 and metallized material 132 is deposited between semiconductor chips 112 at through openings 122 (previously shown in FIG. 13).

Figure 15:
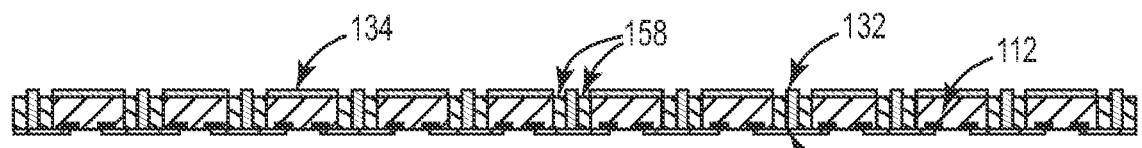
Figure 16:
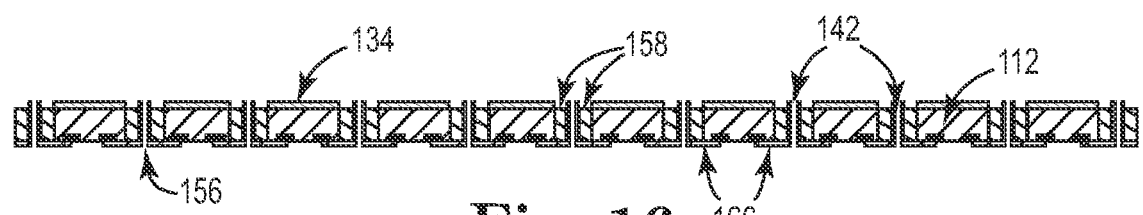
Figure 17:
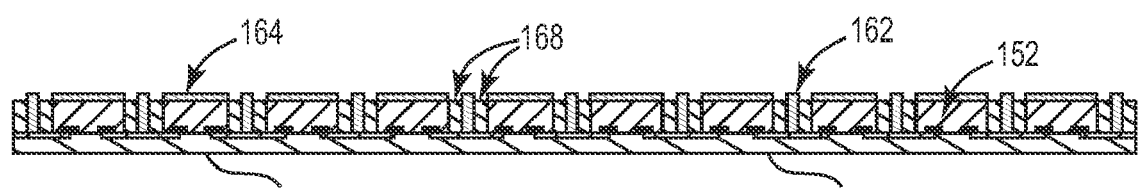
Figure 18:
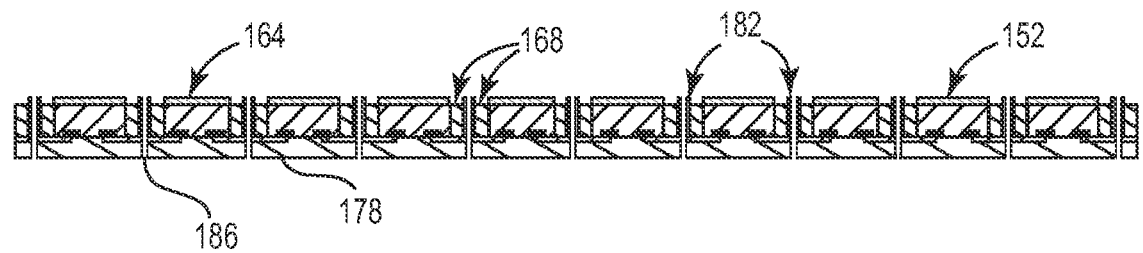

FIGS. 15-18 illustrate embodiment of semiconductor structures for thin dies, similar to the embodiments of power devices shown in FIGS. 5-8. FIG. 15 illustrates the semiconductor structure according to one embodiment. In one embodiment, selective etching of metal deposits is illustrated for source drain and gate contacts. FIG. 16 illustrates the separation of semiconductor chips 112 upon separation of metallized material 142. Separation occurs at through openings 156 by sawing, dicing or other method. Alternatively, semiconductor chips 112 are encapsulated on first face 124 and then singulated, as shown in FIGS. 17 and 18.

Wafer level semiconductor packages are provided that are completely formed on the wafer level and subsequently singulated to provide discrete semiconductor packages. In one embodiment, the semiconductor packages are singulated by sawing through conductive material deposited between chips within each package. Embodiments provide wafer level packages for powered devices including thin wafer level packages for powered devices. In some embodiments, the wafer level packages are subsequently coupled to a redistribution layer suited for attachment to printed circuit boards and other electronic devices.

Figure 19:
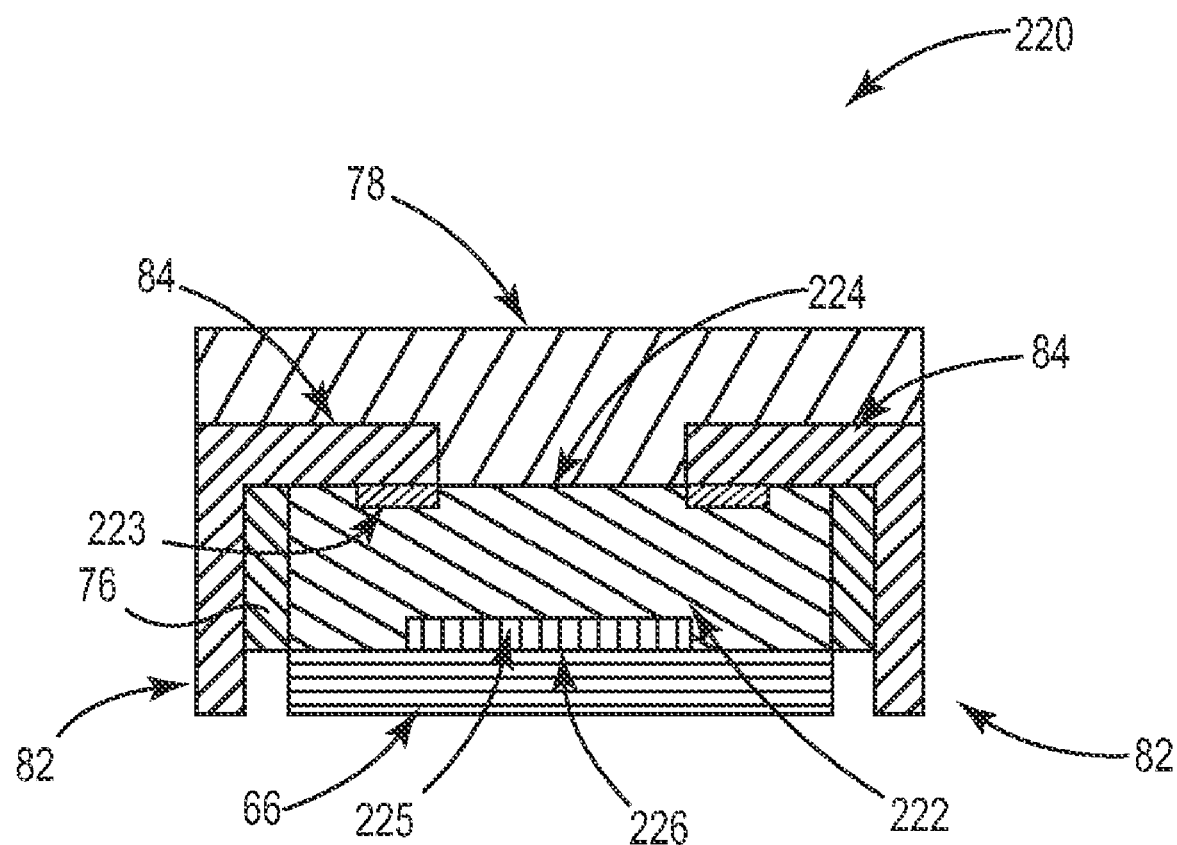
FIG. 19 is schematic cross-sectional view of a vertical power transistor device according to one embodiment.

FIG. 19 is schematic cross-sectional view of a vertical power transistor device 220 according to one embodiment. Device 220 is fabricated in a manner similar to device 200 and includes encapsulant 76/78 at least partially encapsulating chip 222, first and second metal layers 84, 66, and electrically conducting material 82 configured to connect between the first and second metal layers 84, 66. In one embodiment, device 220 additionally includes a first electrode 223 disposed on a first face 224 of chip 222 and a second electrode 225 disposed on a second face 226 of chip 222 opposite first face 224. In one embodiment, first electrode 223 is electrically connected to first metal layer 84 and second electrode 225 is connected to second metal layer 66. In one embodiment, first electrode 223 is a source electrode or emitter and second electrode 225 is a drain electrode or collector. Device 220 thus provides a vertical transistor structure having source electrode on face 224 opposite drain electrode 225 on face 226.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor chip comprising a first face and a second face opposite the first face, the semiconductor chip having a first coefficient of thermal expansion;
an encapsulant comprising inorganic particles encapsulating the semiconductor chip, the encapsulant having a second coefficient of thermal expansion;
a first metal layer attached to the first face of the semiconductor chip;
a second metal layer attached to the second face of the semiconductor chip; and
electrically conducting material configured to connect the first metal layer with the second metal layer;
wherein the first coefficient of expansion and the second coefficient of expansion are of the same order of magnitude.

2. The semiconductor device of claim 1, wherein the encapsulant additionally comprises organic material.

3. The semiconductor device of claim 1, wherein the encapsulant comprises ceramic glass.

4. The semiconductor device of claim 1, wherein the first metal layer laterally extends over the semiconductor chip and the encapsulant.

5. The semiconductor device of claim 1, wherein the second metal layer laterally extends over the semiconductor chip and the encapsulant.

6. The semiconductor device of claim 1, wherein the chips have a first electrode on the first face and a second electrode on the second face.

7. The semiconductor device of claim 6, wherein the first electrode is electrically connected with the first metal layer.

8. The semiconductor device of claim 7, wherein the second electrode is electrically connected with the second metal layer.

9. The semiconductor device of claim 8, wherein the electrically conducting material is structured to extend from the first metal layer to the second metal layer.

10. The semiconductor device of claim 1, wherein the semiconductor chip comprises a power transistor with a first electrode connected with a drain and a second electrode connected with a source.

11. The semiconductor device of claim 1, wherein first coefficient of thermal expansion is approximately $2.5 \times 10^{-6}$/K.

12. The semiconductor device of claim 1, wherein second coefficient of thermal expansion is less than approximately $10 \times 10^{-6}$/K.

13. A semiconductor device, comprising:
a semiconductor chip comprising an active surface opposite a back surface;
an encapsulant comprising sintered particles encapsulating sides of the semiconductor chip;
a first metal layer attached to a first contact on the active surface of the semiconductor chip;
a separate second metal layer attached to a second contact on the active surface of the semiconductor chip; and
electrically conducting material extending between the first metal layer and the back surface and between the separate second metal layer and the back surface.

14. The semiconductor device of claim 13, wherein the encapsulant encapsulates a portion of the active surface.

15. The semiconductor device of claim 13, wherein the encapsulant is disposed between the sides of the semiconductor chip and the electrically conducting material.

16. The semiconductor device of claim 13, wherein the back surface of the semiconductor chip comprises a metallized backside.

* * * * *